(12) United States Patent
Hirzmann et al.

(10) Patent No.: US 11,894,841 B2
(45) Date of Patent: Feb. 6, 2024

(54) METHOD FOR DETECTING CONTACT WITH A MANUALLY ACTIVATED STEERING DEVICE, IN PARTICULAR A VEHICLE STEERING WHEEL, AND A DEVICE FOR CARRYING OUT THE METHOD

(71) Applicant: ZF AUTOMOTIVE SAFETY GERMANY GMBH, Aschaffenburg (DE)

(72) Inventors: Guido Hirzmann, Sailauf (DE); Michael Schillinger, Aschaffenburg (DE)

(73) Assignee: ZF AUTOMOTIVE SAFETY GERMANY GMBH, Aschaffenburg (DE)

( * ) Notice: Subject to any disclaimer, the term of this patent is extended or adjusted under 35 U.S.C. 154(b) by 0 days.

(21) Appl. No.: 17/059,608

(22) PCT Filed: Jun. 5, 2019

(86) PCT No.: PCT/EP2019/064603
§ 371 (c)(1),
(2) Date: Nov. 30, 2020

(87) PCT Pub. No.: WO2019/238486
PCT Pub. Date: Dec. 19, 2019

(65) Prior Publication Data
US 2021/0226627 A1      Jul. 22, 2021

(30) Foreign Application Priority Data

Jun. 11, 2018   (DE) .................... 10 2018 113 879.2

(51) Int. Cl.
*H03K 17/96*       (2006.01)
*G06F 3/041*       (2006.01)

(52) U.S. Cl.
CPC ........... *H03K 17/962* (2013.01); *G06F 3/041* (2013.01); *H03K 2217/96072* (2013.01)

(58) Field of Classification Search
CPC ........ H03K 17/962; H03K 2217/96072; G06F 3/021
See application file for complete search history.

(56) References Cited

U.S. PATENT DOCUMENTS 5,543,588 A * 8/1996 Bisset ................... G06F 1/1626
345/173
10,501,107 B2   12/2019 Bossler et al.
(Continued)

FOREIGN PATENT DOCUMENTS

DE        102015216095     3/2017
JP         2014190856 A  * 10/2014

*Primary Examiner* — Benjamin C Lee
*Assistant Examiner* — Nathan P Brittingham
(74) *Attorney, Agent, or Firm* — TAROLLI, SUNDHEIM, COVELL & TUMMINO L.L.P.

(57) ABSTRACT

A method for detecting contact with a manually activated steering or control device, in particular a vehicle steering wheel, comprises the following steps: applying an alternating voltage to at least one conductor arrangement (10) which is arranged on the steering or control device, and has at least one conductor line with a significant ohmic resistance; determining the current profile in the conductor arrangement (10); determining the real component and the virtual component of the instantaneous alternating current resistance of the conductor arrangement (10); determining the capacitance or the change in capacitance of the conductor arrangement (10); determining the phase shift; and evaluating the determined values. A device for carrying out the method comprises a steering or control device, in particular a vehicle steering wheel, a conductor arrangement (10) which is arranged on the steering or control device and which has at least one conductor line with a significant ohmic resistance, (Continued)

and a control and evaluation device which is configured to apply an alternating voltage to the conductor arrangement (10), to measure the current profile in the conductor arrangement (10) and to evaluate the determined values.

16 Claims, 1 Drawing Sheet

(56) References Cited

U.S. PATENT DOCUMENTS

| | | | | |
|---|---|---|---|---|
| 2003/0135110 A1* | 7/2003 | Leussler | ............... | A61B 5/06 |
| | | | | 600/422 |
| 2005/0239075 A1 | 10/2005 | Yanagidaira et al. | | |
| 2010/0045632 A1 | 2/2010 | Yilmaz et al. | | |
| 2012/0222884 A1* | 9/2012 | Honda | ............... | H01B 3/305 |
| | | | | 174/120 SR |
| 2012/0306512 A1* | 12/2012 | Kandler | ............... | B60N 2/002 |
| | | | | 324/686 |
| 2012/0326735 A1 | 12/2012 | Bennett et al. | | |
| 2013/0009654 A1 | 1/2013 | Kandler | | |
| 2013/0171925 A1* | 7/2013 | Oda | ............... | H04B 15/06 |
| | | | | 455/3.01 |
| 2014/0151356 A1 | 6/2014 | Maguire et al. | | |
| 2014/0224040 A1* | 8/2014 | Van'tzelfde | ............... | B62D 1/046 |
| | | | | 73/862.381 |
| 2014/0253151 A1 | 9/2014 | Kandler et al. | | |
| 2015/0344060 A1* | 12/2015 | Staszak | ............... | G06F 3/044 |
| | | | | 324/697 |
| 2016/0150593 A1* | 5/2016 | Barfuss | ............... | B62D 1/046 |
| | | | | 219/209 |
| 2017/0334392 A1 | 11/2017 | Frey et al. | | |
| 2017/0334477 A1 | 11/2017 | Bossler et al. | | |
| 2018/0106924 A1 | 4/2018 | Maeda et al. | | |
| 2020/0341041 A1* | 10/2020 | Lamesch | ............... | G01D 5/24 |

* cited by examiner

METHOD FOR DETECTING CONTACT WITH A MANUALLY ACTIVATED STEERING DEVICE, IN PARTICULAR A VEHICLE STEERING WHEEL, AND A DEVICE FOR CARRYING OUT THE METHOD

RELATED APPLICATIONS

This application corresponds to PCT/EP2019/064603, filed Jun. 5, 2019, which claims the benefit of German Application No. 10 2018 113 879.2, filed Jun. 11, 2018, the subject matter of which are incorporated herein by reference in their entirety.

BACKGROUND OF THE INVENTION

The invention relates to a method for detecting contact with a manually activated steering or control device, in particular a vehicle steering wheel. The invention also relates to a device for carrying out the method.

Knowing whether the driver of a vehicle is currently touching the steering wheel or not is information that is essential or at least useful for various safety and driver assistance systems. In principle, there are various technical options for detecting steering wheel contact. In particular, devices are known to date in which capacitive or resistive sensors are integrated into the steering wheel.

For certain demanding applications, however, it is necessary, beyond mere contact detection, to locate the contact, i.e. not only a steering wheel contact per se, but also the location of the contact on the steering wheel must be determined. However, such a location determination is technically difficult to implement. Additional lines and components are usually required for this, and the installation effort increases considerably.

DE 10 2014 016 422 A1 discloses a device and a method for detecting steering wheel contact which are based on the fact that a first electrode arranged in the steering wheel forms a sensor capacitor together with the human body functioning as a second electrode and an intermediate dielectric. An evaluation circuit having a charged reference capacitor of a known capacitance can be connected in parallel to said sensor capacitor such that part of the charge of the reference capacitor is transferred to the sensor capacitor. The determination of the change in capacitance of the sensor capacitor required for detection is carried out while taking into account the known capacitance of the reference capacitor and the measured voltage on the reference capacitor before and after the parallel connection of the evaluation circuit. If a plurality of first electrodes, which are distributed over the steering wheel rim and are electrically isolated from one another, are provided, conclusions may be drawn about the specific point of steering wheel contact.

SUMMARY OF THE INVENTION

The object of the invention is to be able to precisely detect the position of contact with a steering or control device using simple means.

This object is achieved by a method for detecting contact with a manually activated steering or control device having the features of claim 1 and by a device for carrying out the method having the features of claim 5. Advantageous and expedient embodiments of the method according to the invention and the device according to the invention are specified in the associated subclaims.

The method according to the invention for detecting contact with a manually activated steering or control device, in particular a vehicle steering wheel, comprises the following steps:

applying an alternating voltage to at least one conductor arrangement which is arranged on the steering or control device, and has at least one conductor line with a significant ohmic resistance;

determining the current profile in the conductor arrangement;

determining the real component and the virtual component of the alternating current resistance of the conductor arrangement;

determining the capacitance or the change in capacitance of the conductor arrangement;

determining the phase shift (phase angle); and evaluating the determined values.

In general, "determining" should include measuring, calculating, otherwise determining or knowing a variable.

The invention is based on the knowledge that there are already established, effective methods for detecting a change in capacitance in capacitive measurement technology. A first basic method is based on the change in the capacitive coupling of a sensor structure with respect to a reference electrode as a result of an action. A second basic method is based on the change in the capacitive coupling of a sensor structure with respect to the environment as a result of an action. The invention extends these methods by including a significant resistance of a conductor line of the conductor arrangement. According to the invention, at least one conductor line of the conductor arrangement has an appreciable ohmic resistance in comparison to, for example, a conventional copper wire line. In this way, an evaluable RC element is formed that can be changed by an action such as manual contact. If the applied alternating voltage is known, the total resistance (impedance) of the conductor arrangement is determined by measuring the current profile. The term "alternating voltage" is intended to include all voltage profiles based on oscillations, in particular sinusoidal, square, triangular and sawtooth oscillations, but also pulse voltages with successive voltage pulses. Because the total resistance of the conductor arrangement is made up of a real component that is determined by the ohmic resistance of the conductor line, and a virtual component that is determined by the capacitance that develops between another conductor line (reference electrode) or the environment, the position of the contact of the steering or control device can be inferred from the phase angle.

A skillful arrangement and design of the conductor arrangement not only enables precise position determination, but in principle movement patterns (gestures) may also be detected and analyzed. After a successful interpretation, a function assigned to the respective identified gesture may be triggered.

Because the core of the invention lies in the evaluation of variables that are easy to measure or determine and, in comparison to other contact detection devices, only one line segment with significant ohmic resistance is required as the only special component aside from a few normal lines, the invention has the advantage that it is inexpensive overall and may be installed without great effort.

The steps of the method according to the invention are preferably carried out continuously. That means that the steering or control device is continuously monitored without major breaks. This is a prerequisite for reliable detection of gestures.

In the method according to the invention, the evaluation of the determined values additionally comprises in particular at least one of the following steps:

detecting whether the steering or control device is contacted over a large area;
detecting whether the steering or control device is contacted at certain points;
grip detection (type of grip);
detecting the number of simultaneous contacts;
locating the positions of a plurality of contacts;
determining the duration of a contact;
identifying gestures.

The more of these steps that are carried out, the more versatile the method according to the invention is.

Thanks to the possibility of a versatile evaluation of the determined values, the method according to the invention may be used to trigger certain functions as a function of the evaluation.

The invention also provides a device for carrying out the method according to the invention. The device comprises a steering or control device, in particular a vehicle steering wheel, a conductor arrangement which is arranged on the steering or control device and has at least one conductor line with a significant ohmic resistance, and a control and evaluation device arranged in the vicinity. The control and evaluation device is configured to apply an alternating voltage to the conductor arrangement, to measure the current profile in the conductor arrangement and to evaluate the determined values. Furthermore, this control and evaluation device is networked with the vehicle, in particular with a higher-order control unit of the on-board electronics.

In this case, an "alternating voltage" should again generally be understood as a voltage profile based on oscillations, in particular a sinusoidal, square, triangular, sawtooth oscillation, but also a pulse voltage with successive voltage pulses.

The provision of a plurality of conductor arrangements distributed over the steering or control device enables, on the one hand, greater reliability and/or accuracy (resolution) when it comes to contact detection. On the other hand, this also enables the detection of multi-touch inputs, similar to a touch-sensitive display.

The conductor arrangement provided according to the invention is preferably arranged below a surface of the steering or control device. In the case of a vehicle steering wheel, this would be, for example, below a casing of the steering wheel rim. In principle, the conductor arrangement should be placed as close as possible to the surface to ensure high sensitivity.

According to a first preferred embodiment of the device according to the invention, the conductor arrangement has two substantially parallel electrical conductors, of which at least one has a significant ohmic resistance which is significantly higher compared to a copper wire, preferably within a range of 10 Ω/m to 1 MΩ/m. In this embodiment, the capacitive coupling of the two conductors changes in the presence of a hand. Thanks to the inclusion of the determined total resistance, the position of the hand may then be determined.

The electrical conductors should each be insulated to prevent undesired coupling with neighboring components or interference.

According to a second preferred embodiment of the device according to the invention, the conductor arrangement has a plurality of sensor fields in the form of electrically conductive surfaces or regions and connected in series by electrical conductors, the electrical conductors having a significant ohmic resistance between the sensor surfaces or regions. The conductor arrangement is thus formed by a series of resistors and conductor surfaces or regions arranged in a row. In combination with a hand, a characteristic RC element is created, the behavior of which may be evaluated by the control and evaluation device in such a way that the position of the hand may be determined. The reliability and accuracy of the contact detection may be optimized through the number, shape, size and arrangement of the sensor fields or regions. In order to keep the costs for the device low, a skillful arrangement and design of the conductor arrangement is preferred such that as few sensor surfaces or regions as possible have to be installed and as few cables or conductor tracks as possible have to be laid.

According to another preferred aspect of the invention, the conductor line has one or more elongated electrical conductors with a significant ohmic resistance which is or are laid in a specific manner such that RC elements are formed which can be evaluated in sequence.

In general, thanks to the versatile evaluation options already mentioned, it is possible to configure the control and evaluation device in such a way that certain functions can be triggered as a function of the evaluation. In this case, the device serves as a complex command input device with which the operator may selectively call up certain functions.

BRIEF DESCRIPTION OF THE DRAWINGS

Further features and advantages of the invention will become apparent from the following description and from the accompanying drawings, to which reference is made. In the drawings.

DESCRIPTION

In the following, a device for detecting contact with a manually activated steering or control device is described using the example of a vehicle steering wheel.

Figure 1:
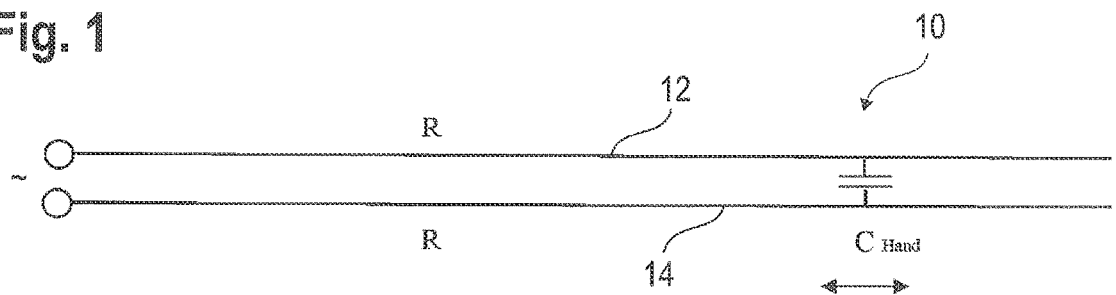
FIG. 1 shows a first embodiment of a conductor arrangement for a device according to the invention for detecting contact with a manually activated steering or control device.

According to a first embodiment of the device, a first conductor arrangement 10 having two parallel electrical conductors 12, 14 is arranged in the rim of the steering wheel, as shown symbolically in FIG. 1. More specifically, the conductor arrangement 10 is arranged under a decorative surface of the steering wheel, for example under a leather covering.

The conductor arrangement runs along the entire circumference or at least a substantial part of the steering wheel rim. Alternatively, a plurality of such conductor arrangements 10 are provided, each of which is arranged in a partial region of the steering wheel rim. In addition, a plurality of conductor arrangements 10 may be distributed over the toroidal circumference of the steering wheel rim.

The two conductors 12, 14 are provided with insulation, i.e. they are insulated from each other and from their environment.

The two conductors 12, 14 form a capacitance with respect to one another. In the case of two wires of the same thickness made of the same electrically conductive material, the capacitance C would be calculated as follows:

$$C = \frac{\pi \varepsilon l}{\operatorname{arcos} h\left(\frac{d}{2R}\right)}$$

where ε: dielectric constant between the conductors
l: length of the conductors
d: distance between the conductor central axes
R: radius of the conductor cross sections A special feature of the first conductor arrangement 10 provided for the device described here is that at least one line segment, i.e. at least one of the two conductors 12, 14 has a significant ohmic resistance compared to a copper wire, in particular within a range of 10 Ω/m to 1 MΩ/m. The total ohmic resistance or the specific resistance of the conductors 12, 14 is known to a control and evaluation device.

If an alternating voltage, i.e. a voltage having a profile based on an oscillation (such as a sinusoidal, square, triangular, or sawtooth oscillation) or a pulse voltage having successive voltage pulses is applied to the conductor arrangement 10, the total resistance consists of a real component and a virtual component. The real component is determined by the resistive conductor 12 or 14 and the virtual component by the capacitance that develops between the conductors 12, 14. A certain phase angle is set for the total resistance.

If a hand comes very close to the conductors, as is the case when contacting the steering wheel rim, the capacitance of the conductor arrangement changes significantly ($C_{hand}$). This means that the virtual component of the total resistance changes and, as a result, so does the phase angle. If the alternating voltage is known, this detuning may be recognized and registered by measuring the current profile. In addition, a precise conclusion about the position of the hand on the steering wheel may be drawn in the control and evaluation device based on the change in the real component and the virtual component or the change in the phase angle.

In the context of permanent monitoring by the control and evaluation device, both contact per se and movement patterns (gestures) may be recognized in this way. The control and evaluation device may interpret certain gestures and trigger functions that are assigned to the gestures.

If a plurality of separate conductor arrangements 10 are distributed over the steering wheel, a plurality of simultaneous steering wheel contacts (two hands on the steering wheel) may be distinguished.

The arrangement of the conductor arrangement(s) 10 is not limited to the steering wheel rim, but can also extend to the spokes and the central part of the steering wheel. In addition, any course of the parallel conductors 12, 14 that is advantageous for the evaluation may be provided, for example a regular or irregular meandering course.

Figure 2:
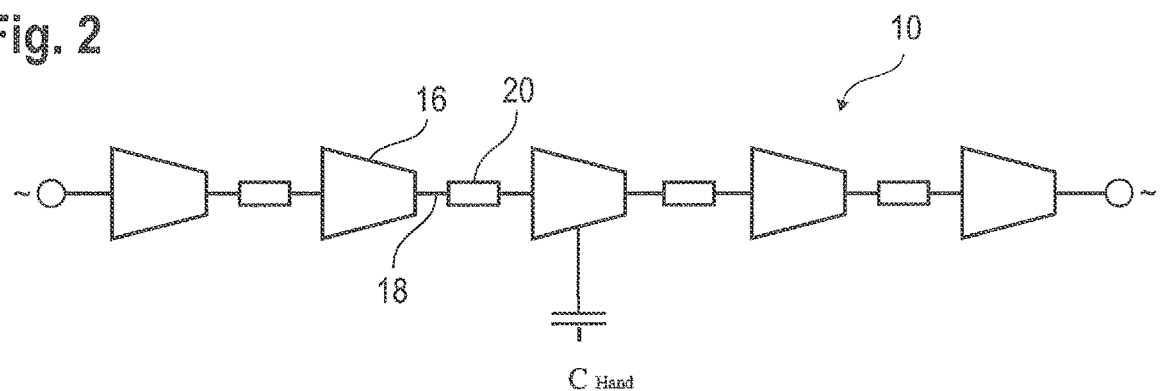
FIG. 2 shows a second embodiment of a conductor arrangement for a device according to the invention for detecting contact with a manually activated steering or control device.

FIG. 2 symbolically shows a second conductor arrangement 10 that is provided for a second embodiment of the device for detecting contact with a manually activated steering or control device. The second embodiment is also described below using the example of a vehicle steering wheel.

The second conductor arrangement 10 consists substantially of a conductor line having a plurality of sensor fields 16 that are connected to one another in an electrically conductive manner. The sensor fields 16 are electrically conductive surfaces or regions that, for example may be formed from foils, conductive varnishes, wire meshes, wire mats or other wire structures. It is crucial for the sensor fields 16 to be electrically conductive and to be able to generate a significant capacitive field in relation to a hand.

The electrical conductors 18 between the sensor fields 16 in turn have an ohmic resistance that is significantly higher than the resistance, for example, of a copper wire or the like. Either the conductors 16 themselves may be resistive, or electrical components 20, conductor portions or the like with a significant ohmic resistance are connected in series.

As in the first embodiment, the second conductor arrangement 10 is also arranged under a decorative surface of the steering wheel, for example under a leather covering. The conductor arrangement 10 runs along the entire circumference or at least a substantial part of the steering wheel. Alternatively, a plurality of such conductor arrangements 10 are provided, each of which is arranged in a partial region of the steering wheel rim.

If a hand comes very close to a sensor field of the second conductor arrangement 10, as is the case when the steering wheel rim is contacted, a capacitance is formed or the capacitance (Oland) changes with respect to the capacitance between the conductor arrangement 10 and the environment without a hand in the immediate vicinity. The presence of the hand in turn determines or changes the virtual component of the total resistance of the conductor arrangement 10. A certain phase angle is set depending on the position of the hand. Similar to the first embodiment, if the applied alternating voltage is known, an evaluation in the control and evaluation device is possible by measuring the current profile, which allows a precise conclusion to be drawn about the position of the hand on the steering wheel.

The accuracy of the position determination (resolution) in the second embodiment depends in particular on the number, shape, size and arrangement of the sensor fields 16.

In principle, the same applies to the second embodiment with regard to the arrangement of the second conductor arrangement 10 (steering wheel rim, steering wheel spokes, steering wheel center part), to the provision and distribution of a plurality of second conductor arrangements 10 and to gesture detection as in the first embodiment.

The sensor fields 16 may be generated and sampled (measured) not only capacitively, but also inductively, resistively, digitally (switch), magnetically and optically. Combinations are also possible, such as capacitive-resistive sensor fields 16.

The sampling of the sensor fields 16 may take place sequentially or in parallel, it being possible for the sensor fields 16 to be sampled individually or in groups.

Figure 3:
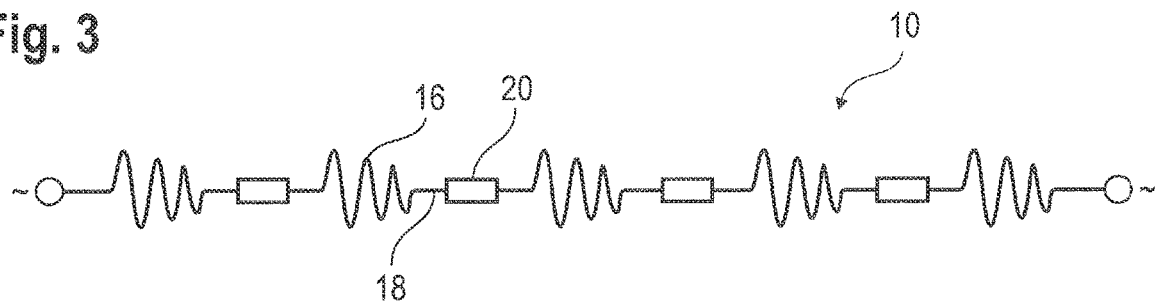
FIG. 3 shows a third embodiment of a conductor arrangement for a device according to the invention for detecting contact with a manually activated steering or control device.
Figure 4:
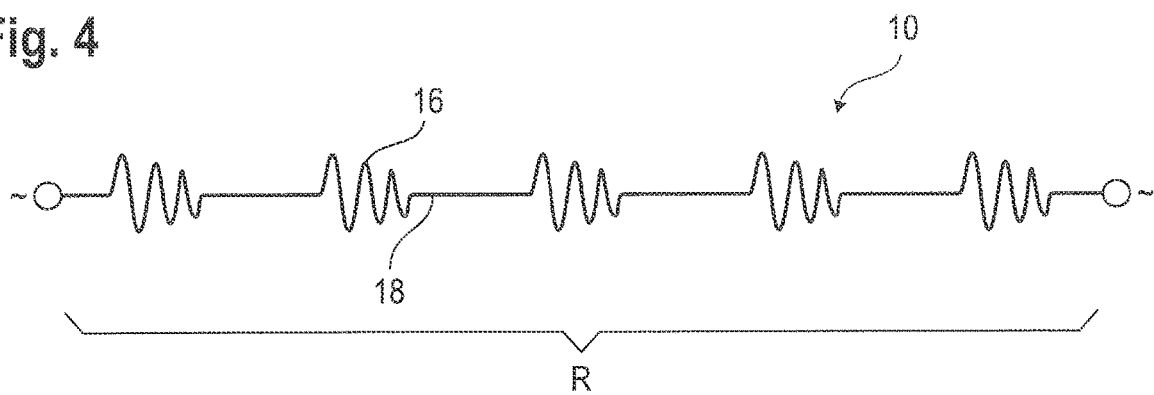
FIG. 4 shows a fourth embodiment of a conductor arrangement for a device according to the invention for detecting contact with a manually activated steering or control device.

FIGS. 3 and 4 symbolically show two further conductor arrangements 10 that are provided for a third or fourth embodiment of the device for detecting contact with a manually activated steering or control device.

In the conductor arrangement 10 shown in FIG. 3, the sensor fields 16 are formed by elongated electrical conductors 18 that are tightly curved or twisted in certain regions or have some other very strongly curved course that deviates significantly from a straight course. Because the electrical conductors 18 have such a specific course, the sensor surfaces 16, together with the intermediate (straight) conductor portions that have a significant ohmic resistance and/or with interposed components 20 (electrical resistance elements or the like), form individual RC elements. Said RC elements are evaluated in sequence.

The conductor arrangement 10 shown in FIG. 4 largely corresponds to that of FIG. 3. However, no resistors in the form of components or the like are inserted between the sensor fields 16. Instead, when the measured current profile is evaluated in the control and evaluation device, the known total resistance R of the electrical conductor 18 is taken into account.

With all embodiments, it is possible to distinguish between different types of contact, such as prolonged contact at a localizable point, knocking movements, stroking movements (including the direction), etc. by means of a suitable evaluation algorithm. This makes it possible to carry out functions that go beyond the detection of steering wheel contact per se in the context of safety and driver assistance systems and possibly the knowledge of whether the steering wheel is being gripped safely. In particular, grip detection is possible, i.e. the type of grip with which the driver grips or grasps the steering wheel may be recognized.

The most important differentiation possibilities and some of the functions that are introduced with them (assuming suitable placement and design of the conductor arrangements 10) are listed again as examples below:

generally recognizing whether the steering wheel is fully grasped manually or whether the steering wheel is only touched selectively with a finger, etc.;
detecting a contact at certain points (e.g. knocking) interpretation as a keystroke;
detecting the positions of contacts at certain points interpretation as different keystrokes;
detecting the number of simultaneous contacts conclusion about one-handed or two-handed steering wheel contact and/or multi-touch inputs;
detecting the duration of a certain contact use for stepless setting of parameters;
detecting certain gestures triggering assigned functions such as setting turn signals (left, right), turning on windshield wipers, radio control, in general within applications: "forward," "back" etc.

The two embodiments described or certain aspects thereof can of course also be combined with one another.

The invention was explained using the example of a vehicle steering wheel, but is not restricted to this application. The contact detection according to the invention may in principle be used with any manually activated steering or control devices of motor vehicles, trains, machines, etc.

The invention claimed is:

1. A device for detecting contact with a manually activated steering wheel of a vehicle, the device comprising:
   the steering wheel,
   a conductor arrangement (10) having a plurality of sensor surfaces or regions (16) on the steering wheel that are connected to one another in series by means of electrical conductor lines (18) that extend entirely on the steering wheel between adjacent sensor surfaces or regions (16), the electrical conductor lines (18) having a significant ohmic resistance between the sensor surfaces or regions (16), each electrical conductor line (18) forming or being connected to a resistor on the steering wheel between two adjacent sensor surfaces or regions (16) so that the conductor arrangement (10) is formed by an alternating sequence of resistors and conductor surfaces or regions (16) arranged in a row on the steering wheel,
   wherein each resistor formed by or connected to a corresponding electrical conductor line (18) on the steering wheel has a resistance that is significantly higher compared to a copper wire and within a range of 10 Ω/m to 1 MΩ/m, and
   a control unit configured
   to apply an alternating voltage to the conductor arrangement (10),
   to determine a current in the conductor arrangement (10), and
   to evaluate the determined values.

2. The device according to claim 1, wherein a plurality of conductor arrangements (10) distributed over the steering wheel are provided.

3. The device according to claim 1, wherein the conductor arrangement (10) is arranged under a surface of the steering wheel.

4. The device according to claim 1, wherein the electrical conductor lines (18) are each insulated.

5. The device according to claim 1, wherein the plurality of sensor surfaces or regions (16) are in the form of electrically conductive surfaces or regions.

6. The device according to claim 5, wherein the electrically conductive surfaces or regions (16) are formed from at least one of foils, conductive varnishes, wire meshes, and wire mats.

7. The device according to claim 1, wherein at least one of the electrical conductor lines (18) is laid in a specific manner such that at least one RC element is formed which can be evaluated in sequence.

8. The device according to claim 1, wherein the control unit is configured to trigger certain functions as a function of the evaluation.

9. The device according to claim 1, wherein the electrical conductor lines (18) include first portions at which the electrical conductor lines (18) are tightly curved or twisted and second portions at which the electrical conductor lines (18) are substantially straight, the first portions forming the sensor surfaces or regions (16), the first portions being connected in series by means of the second portions, the second portions having the significant ohmic resistance between the first portions.

10. The device according to claim 1, wherein the vehicle is a motor vehicle or a train.

11. A method for detecting contact with a manually activated steering wheel of a vehicle, the method comprising:
   providing the device according to claim 1;
   applying an alternating voltage to the conductor arrangement (10);
   determining a current in the conductor arrangement (10);
   determining a real component and an imaginary component of a resistance of the conductor arrangement (10);
   determining a capacitance or a change in capacitance of the conductor arrangement (10);
   determining a phase shift; and
   evaluating the determined values.

12. The method according to claim 11, wherein the steps of the method are carried out continuously.

13. The method according to claim 11, wherein the evaluation comprises at least one of the following steps:
   detecting whether the steering wheel is contacted over a large area;
   detecting whether the steering wheel is contacted at certain points;
   grip detection;
   detecting a number of simultaneous contacts;
   locating the positions of a plurality of contacts;
   determining a duration of a contact; and
   identifying gestures.

14. The method according to claim 13, wherein certain functions are triggered as a function of the evaluation.

15. The device according to claim 1, wherein each electrical conductor line (18) that extends on the steering wheel between two adjacent sensor surfaces or regions (16) is connected to a separate resistor (20).

16. The device according to claim 1, wherein each electrical conductor line (18) that extends on the steering wheel between two adjacent sensor surfaces or regions (16) includes a first end connected directly to a first one of the adjacent sensor surfaces or regions (16) and a second end connected directly to a second one of the adjacent sensor surfaces or regions (16).

* * * * *